United States Patent
Moriwaki et al.

(10) Patent No.: US 9,285,533 B2
(45) Date of Patent: Mar. 15, 2016

(54) DISPLAY APPARATUS

(75) Inventors: Hiroyuki Moriwaki, Osaka (JP); Kazutaka Hanaoka, Osaka (JP); Yozo Narutaki, Osaka (JP); Hisashi Watanabe, Osaka (JP)

(73) Assignee: SHARP KABUSHIKI KAISHA, Osaka (JP)

(*) Notice: Subject to any disclaimer, the term of this patent is extended or adjusted under 35 U.S.C. 154(b) by 306 days.

(21) Appl. No.: 13/978,282

(22) PCT Filed: Jan. 6, 2012

(86) PCT No.: PCT/JP2012/050175
§ 371 (c)(1),
(2), (4) Date: Jul. 3, 2013

(87) PCT Pub. No.: WO2012/096231
PCT Pub. Date: Jul. 19, 2012

(65) Prior Publication Data
US 2013/0279177 A1    Oct. 24, 2013

(30) Foreign Application Priority Data
Jan. 13, 2011 (JP) .................................. 2011-005041

(51) Int. Cl.
*G09F 13/08* (2006.01)
*F21V 8/00* (2006.01)
(Continued)

(52) U.S. Cl.
CPC .......... *G02B 6/0081* (2013.01); *G02F 1/13336* (2013.01); *G02F 1/133524* (2013.01); *G02F 2001/133562* (2013.01); *H01L 27/3293* (2013.01)

(58) Field of Classification Search
CPC .............. H01L 27/3293; G02B 6/0081; G02F 1/13336; G02F 1/133524; G02F 2001/133562
USPC .................................. 362/97.1, 561, 617, 606
See application file for complete search history.

(56) References Cited

U.S. PATENT DOCUMENTS

| 6,483,482 B1 | 11/2002 | Kim |
| 2007/0065091 A1 | 3/2007 | Hinata et al. |
| 2011/0025594 A1 | 2/2011 | Watanabe |

FOREIGN PATENT DOCUMENTS

| JP | 60-242424 A | 12/1985 |
| JP | 05-188873 A | 7/1993 |

(Continued)

OTHER PUBLICATIONS

Machine Translation of WO 2009/122691 A1 (published date of the WO 2009122691:Oct. 8, 2009).*

(Continued)

*Primary Examiner* — Sean Gramling
*Assistant Examiner* — Naomi M Wolford
(74) *Attorney, Agent, or Firm* — Keating & Bennett, LLP

(57) ABSTRACT

A display apparatus capable of reliably supporting a display panel and making a juncture between displays inconspicuous is provided. A display includes a liquid crystal panel having a front surface and a back surface, a module containing a backlight unit for driving the liquid crystal panel, a rear surface side housing for protecting and holding the backlight unit, and a convex lens arranged to cover a frame region of the liquid crystal panel, for guiding light from the front surface of the liquid crystal panel to a front surface side of the frame region and supporting the liquid crystal panel from the front surface.

4 Claims, 4 Drawing Sheets

(51) Int. Cl.
*G02F 1/1333* (2006.01)
*G02F 1/1335* (2006.01)
*H01L 27/32* (2006.01)

(56) References Cited

FOREIGN PATENT DOCUMENTS

| JP | 11-142818 A | 5/1999 |
| JP | 2000-180964 A | 6/2000 |
| JP | 2001-005414 A | 1/2001 |
| JP | 2004-524551 A | 8/2004 |
| JP | 2007-114737 A | 5/2007 |
| JP | 2010-204553 A | 9/2010 |
| WO | 02/42838 A1 | 5/2002 |
| WO | 2009/122691 A1 | 10/2009 |
| WO | WO 2009122691 A1 * | 10/2009 |

OTHER PUBLICATIONS

Official Communication issued in International Patent Application No. PCT/JP2012/050175, mailed on Jan. 31, 2012.

* cited by examiner

DISPLAY APPARATUS

TECHNICAL FIELD

The present invention relates to a display apparatus and particularly to a display apparatus used for a multi-display system.

BACKGROUND ART

A multi-display system has attracted attention as means for implementing a large-screen display. For example, Japanese Patent Laying-Open No. 2000-180964 (PTD 1) discloses such a construction that, in order to make a joint in multiple screens inconspicuous, a lenticular transparent screen having a structure like a convex lens in a periphery and having a planar central portion is attached to a light emission side of each parallel-plate screen block on which an image is projected. Japanese Patent Laying-Open No. 60-242424 (PTD 2) discloses a construction of a transmissive liquid crystal matrix display apparatus having two or more display panels connected to one another, in which a lens or a prism is provided at a display panel connection portion.

Japanese Patent Laying-Open No. 5-188873 (PTD 3) discloses a large-screen display apparatus in which a front surface of a front panel is made as a curved surface so that light emitted from each light emission spot is refracted and an apparent light emission spot is provided on a side plate provided around the front panel, and thus light can be emitted even at a display element joint portion in the case of tiling. WO02/42838 (PTD 4) discloses a construction that a cover plate assembly covering a display area is laminar and an upper translucent plastics layer thereof is curved at the edge to provide a lens there.

CITATION LIST

Patent Document

PTD 1: Japanese Patent Laying-Open No. 2000-180964
PTD 2: Japanese Patent Laying-Open No. 60-242424
PTD 3: Japanese Patent Laying-Open No. 5-188873
PTD 4: WO02/42838

SUMMARY OF INVENTION

Technical Problem

Japanese Patent Laying-Open No. 60-242424 (PTD 2) discloses a technique for improving a method of display at a connection portion where no liquid crystal drive pixel is present, by providing a lens or a prism at the connection portion of liquid crystal display apparatuses arranged in matrix. In the liquid crystal display apparatus, a frame portion of a liquid crystal panel is normally supported by a housing from the front of the apparatus. On the other hand, Japanese Patent Laying-Open No. 60-242424 (PTD 2) does not show a housing and does not specify a feature for supporting the liquid crystal panel. Therefore, Japanese Patent Laying-Open No. 60-242424 (PTD 2) does not disclose the technique allowing reliable support of a liquid crystal panel and making a juncture between displays inconspicuous. Other documents similarly fail to disclose such a technique.

The present invention was made in view of the problems described above, and a primary object thereof is to provide a display apparatus capable of reliably supporting a display panel and making a juncture between displays inconspicuous.

Solution to Problem

A display apparatus according to the present invention includes a display panel having a front surface and a back surface, a module for driving the display panel, a housing for protecting and holding the module, and a light guide member arranged to cover a peripheral portion of the display panel, for guiding light from the front surface of the display panel to a front surface side of the peripheral portion and supporting the display panel from the front surface.

In the display apparatus above, preferably, the light guide member includes a planoconvex lens causing its flat surface to be in surface contact with the front surface of the display panel.

In the display apparatus above, preferably, the light guide member includes an extension portion extending from the flat surface toward the housing and attached to the housing.

The display apparatus above preferably further includes an elastic member interposed between the flat surface and the housing.

The display apparatus above is preferably a liquid crystal display apparatus.

Advantageous Effects of Invention

According to the display apparatus of the present invention, a display panel can reliably be supported and a juncture between displays can be made inconspicuous.

DESCRIPTION OF EMBODIMENTS

Figure 1:
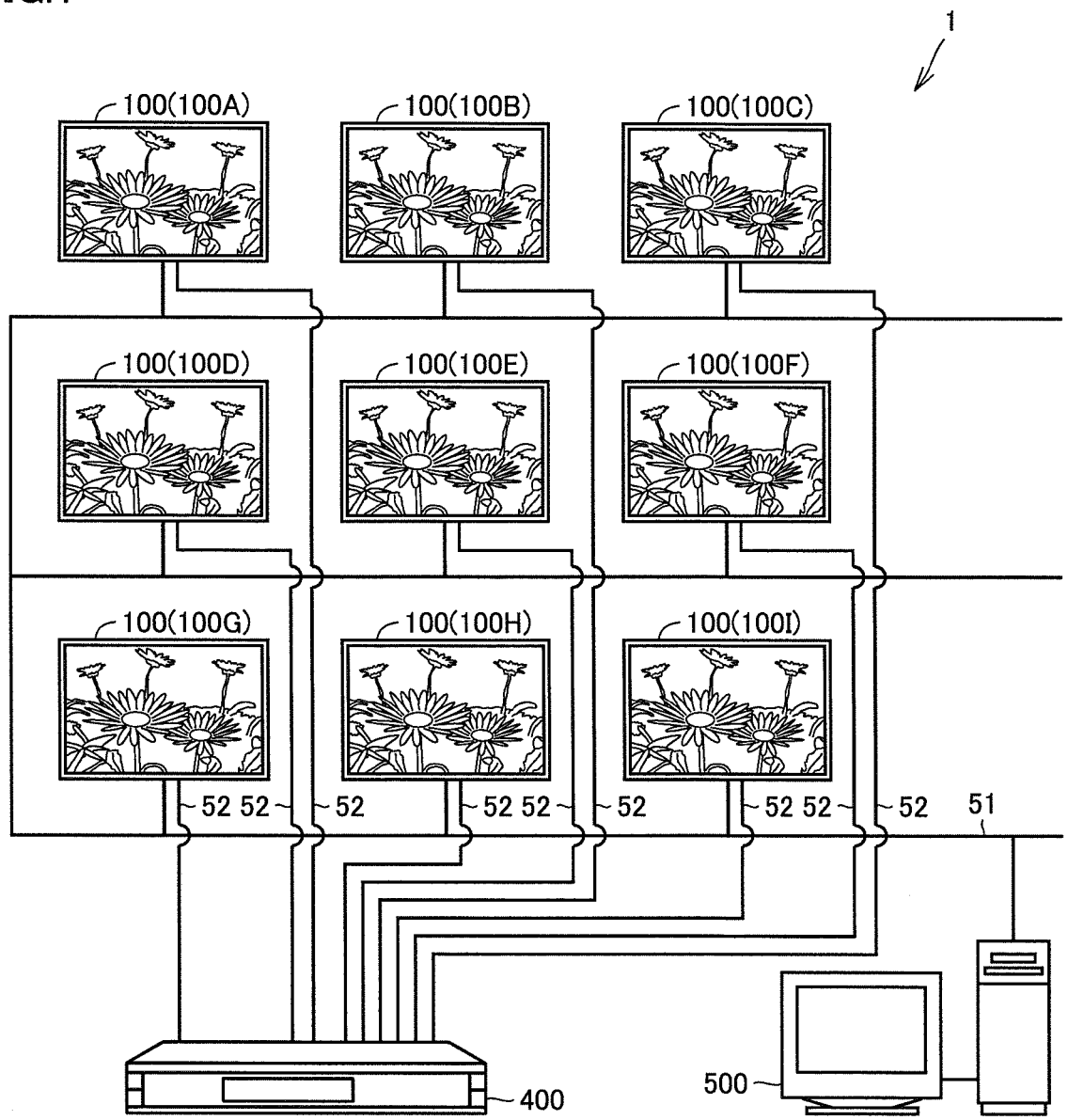
FIG. 1 is a conceptual diagram showing an overall construction of a multi-display according to the present embodiment.

An embodiment of this invention will be described hereinafter with reference to the drawings. In the drawings below, the same or corresponding elements have the same reference characters allotted and description thereof will not be repeated.

(First Embodiment)

FIG. 1 is a conceptual diagram showing an overall construction of a multi-display 1 according to the present embodiment. Multi-display 1 shown in FIG. 1 includes a plurality of displays 100A, 100B, 100C, 100D, 100E, 100F, 100G, 100H, 100I, a content output apparatus 400, and an administration PC 500. Displays 100A to 100I and administration PC 500 communicate with one another through a first network 51. Displays 100A to 100I and content output apparatus 400 communicate with one another through a second network 52.

Displays 100A to 100I are implemented by such equipment as a liquid crystal television and a plasma television. In addition, the network above is implemented, for example, by networks complying with such specifications as wired LAN (Local Area Network), wireless LAN, RS-232C (Recommended Standard 232 version C), and HDMI-CEC (High Definition Multimedia Interface-Consumer Electronics Control).

Administration PC 500 and content output apparatus 400 may be the same apparatus. In addition, though displays 100A to 100I are configured to display contents received from single content output apparatus 400, they may receive display contents from individually different apparatuses, respectively.

Figure 2:
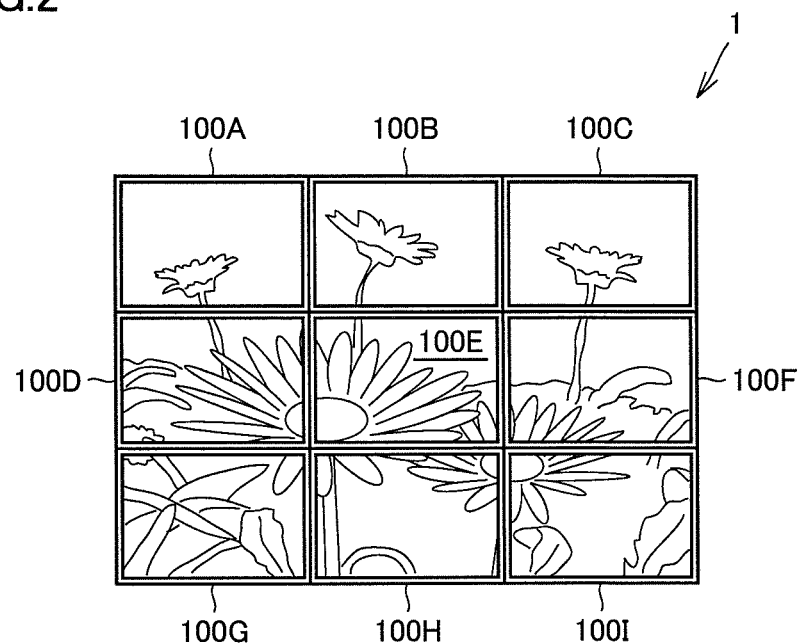
FIG. 2 is a schematic diagram showing an assembled state of the multi-display according to the present embodiment.

FIG. 2 is a schematic diagram showing an assembled state of multi-display 1 according to the present embodiment. More specifically, FIG. 2 shows a state that nine displays 100A to 100I included in multi-display 1 are assembled together and display one video image in a zoomed-in manner. Based on user's operation instructions, displays 100A to 100I may display different video images forming a part of one video image, respectively, may each display the same video image (without zoom-in) as shown in FIG. 1, or may each display a different video image.

Figure 7:
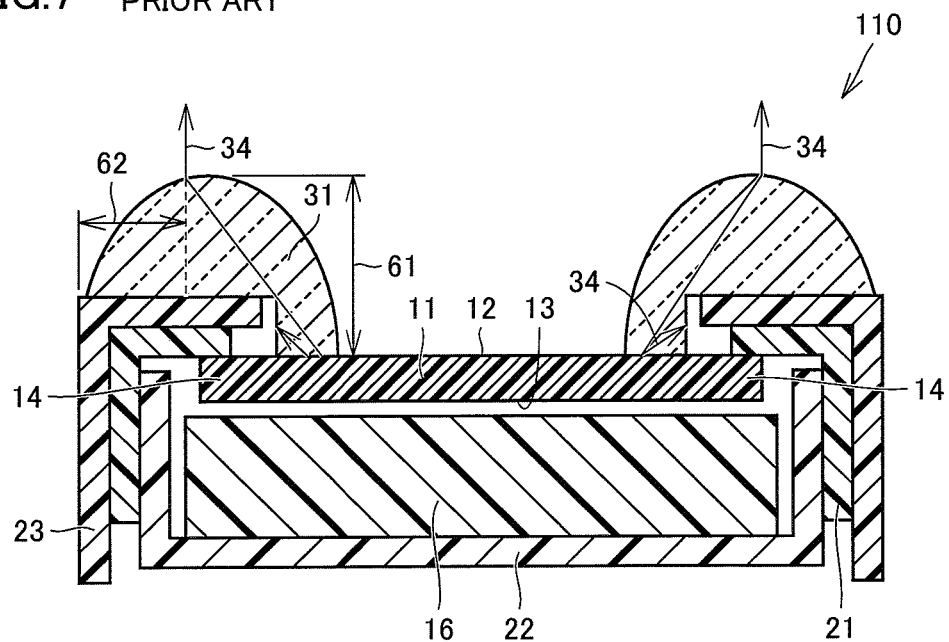
FIG. 7 is a cross-sectional view showing one example of a construction of a conventional display.

A construction of each of displays 100A to 100I (collectively referred to as a display 100) shown in FIGS. 1 and 2 will be described below. Initially, for comparison with display 100 in the present embodiment, a conventional display 110 will be described with reference to FIG. 7. FIG. 7 is a cross-sectional view showing one example of a construction of conventional display 110. Display 110 shown in FIG. 7 includes a liquid crystal panel 11 for displaying an image, a backlight unit 16 for irradiating liquid crystal panel 11 with light, a rear surface side housing 22 for supporting backlight unit 16, a front surface side housing 21 for supporting liquid crystal panel 11 from a side of a front surface 12, a decorative panel 23 covering front surface side housing 21, and a convex lens 31 representing one example of a light guide member.

In a cross-sectional view of display 100, 110 which will be described below, since an upper side of the drawing is a side on which display 100, 110 displays a video image, this side is referred to as the front surface side. A lower side of the drawing opposite to the front surface side is referred to as a rear surface side. A user who uses display 100, 110 can visually recognize a video image or an image displayed on display 100, 110 from the front surface side.

Liquid crystal panel 11 is formed in a shape of a two-dimensionally rectangular flat plate. Liquid crystal panel 11 has front surface 12 on a side where light is emitted to the outside and a back surface 13 opposite to front surface 12. Liquid crystal panel 11 displays a video image, an image, or the like on front surface 12, so as to allow visual recognition of the video image, the image, or the like from the front surface side of display 110.

Backlight unit 16 contains a light source such as a cold-cathode tube or an LED (Light Emitting Diode) and a light guide plate for guiding light from the light source to liquid crystal panel 11. The light source is arranged to be opposed to a side surface or a rear surface of the light guide plate so that light is incident on the light guide plate. The light guide plate guides light emitted from the light source and causes light to emit from a surface opposed to liquid crystal panel 11, so that back surface 13 of liquid crystal panel 13 is irradiated with light.

Rear surface side housing 22 is formed in a shape of a rectangular box with bottom and provided to be able to accommodate backlight unit 16 in its internal space. Backlight unit 16 is arranged within rear surface side housing 22. As a surface on the rear surface side of backlight unit 16 and a bottom surface of rear surface side housing 22 are in contact with each other, backlight unit 16 is supported by rear surface side housing 22.

Front surface side housing 21 is arranged to be in contact with a frame region 14 on a side of front surface 12 of liquid crystal panel 11. Front surface side housing 21 is formed in a frame shape and has a window portion formed such that front surface 12 of liquid crystal panel 11 can externally be observed. Liquid crystal panel 11 is supported by front surface side housing 21 at frame region 14 at its peripheral edge, and it is constructed such that an image emitted from a display area inside frame region 14 can be seen through the window portion of front surface side housing 21. Front surface side housing 21 extends across liquid crystal panel 11 and rear surface side housing 22, and it is arranged such that an inner surface of a side portion of front surface side housing 21 is opposed to an outer surface of a side portion of rear surface side housing 22 and attached to rear surface side housing 22.

Decorative panel 23 is fixed to front surface side housing 21. Decorative panel 23 is arranged to externally cover the entire front surface and side surface of front surface side housing 21. Decorative panel 23 is provided to protect display 110 and improve appearance of display 110. For example, by providing decorative panel 23 formed of a material having metallic gloss on the front surface, display 110 can be provided with quality appearance.

Convex lens 31 is formed of a material having a light transmitting property such as an acrylic resin. Convex lens 31 is arranged to be in contact with front surface 12 of liquid crystal panel 11 and to cover front surface side housing 21 and decorative panel 23 from the front surface side. Convex lens 31 is formed in a shape of a frame covering the entire peripheral edge of liquid crystal panel 11 in a rectangular plate shape. Convex lens 31 is arranged on the front surface side of display 110 with respect to front surface side housing 21 and rear surface side housing 22. Convex lens 31 projects from the rear surface side to the front surface side of display 110. A rear surface side of convex lens 31 is formed in such a shape that a plurality of flat surfaces are combined, and one of the flat surfaces is in contact with front surface 12 of liquid crystal panel 11 and another one of the flat surfaces is in contact with an outer surface of decorative panel 23 on the front surface side.

In frame region 14, since front surface side housing 21 and decorative panel 23 cover front surface 12 of liquid crystal panel 11, light cannot directly be guided from liquid crystal panel 11 to the front surface side of frame region 14. Then, like an optical path 34 shown with an arrow in FIG. 7, light emitted from front surface 12 of liquid crystal panel 11 is refracted by convex lens 31 such that light passes through convex lens 31. By providing convex lens 31, display 110 is constructed to guide light toward the front surface of frame region 14 and to decrease an area in a peripheral portion of display 110 where no video image is displayed.

According to the construction of display 110 shown in FIG. 7, convex lens 31 has a portion in direct contact with front surface 12 of liquid crystal panel 11 on an inner peripheral side and has a portion where front surface side housing 21 and decorative panel 23 are interposed between convex lens 31 and front surface 12 of liquid crystal panel 11 on an outer peripheral side. In this construction, in order to guide light as far as an end of display 110, a lens thickness 61 shown with a double-headed arrow in FIG. 7 should be increased. As lens thickness 61 is increased, a thickness of display 110 as a whole and weight of display 110 increase. In addition, in the construction shown in FIG. 7, front surface side housing 21 and decorative panel 23 restrict optical path 34, and hence light cannot reach an end side of display 110 and an area 62 where no light reaches is present at an end portion of display 110. Therefore, visual quality at the end portion of display 110 lowers.

Figure 3:
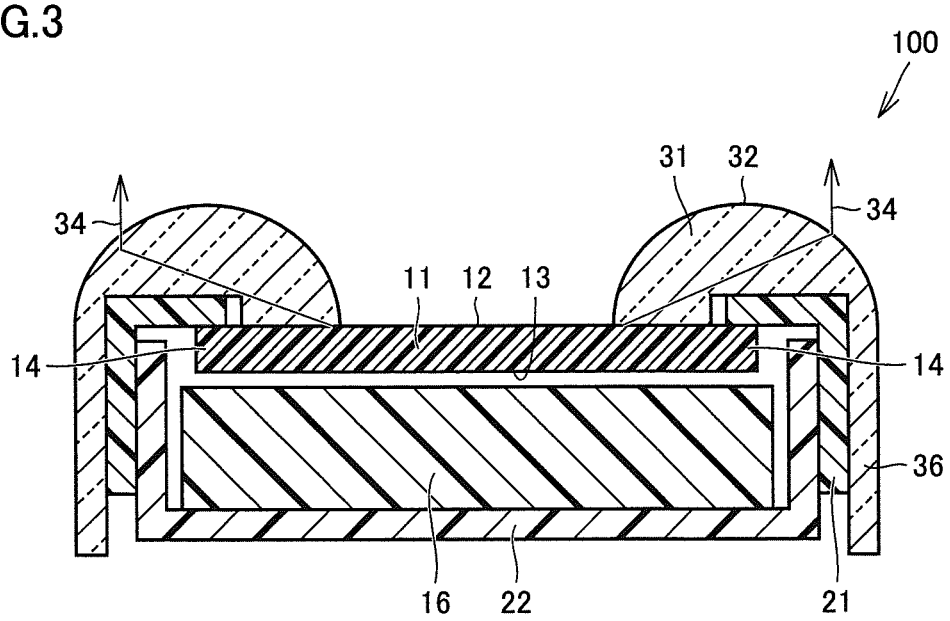
FIG. 3 is a cross-sectional view showing a construction of a display in a first embodiment.
Figure 4:
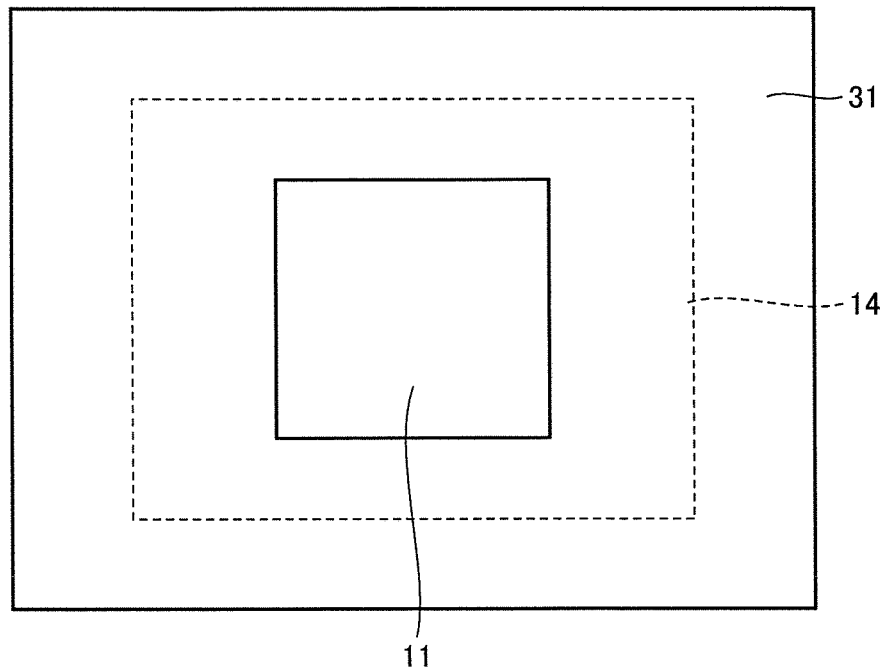
FIG. 4 is a plan view of the display shown in FIG. 3.

Display 100 according to the present embodiment aims to overcome the drawbacks of conventional display 110 described above. FIG. 3 is a cross-sectional view showing a construction of display 100 in a first embodiment. FIG. 4 is a plan view of display 100 shown in FIG. 3.

Display 100 shown in FIG. 3 is a liquid crystal display apparatus representing one example of a display apparatus making use of liquid crystal for displaying a video image. Likewise conventional display 110 described with reference to FIG. 7, display 100 includes liquid crystal panel 11 serving as a display panel having front surface 12 and back surface 13, backlight unit 16 arranged on the rear surface side with respect to liquid crystal panel 11 and irradiating liquid crystal panel 11 with light, and rear surface side housing 21 for protecting and holding backlight unit 16. Backlight unit 16 and an electrode contained in liquid crystal panel 11 are contained in a module for driving liquid crystal panel 11.

When FIGS. 3 and 7 are compared with each other, conventional display 110 includes decorative panel 23, whereas display 100 in the first embodiment does not include decorative panel 23. Convex lens 31 serving as a light guide member is in direct contact with front surface side housing 21 and attached to front surface side housing 21 without decorative panel 23 being interposed. Convex lens 31 is arranged on the front surface side of display 100 with respect to front surface side housing 21 and rear surface side housing 22 and covers front surface side housing 21 from the front surface side. As shown in FIG. 4, convex lens 31 is formed in a shape of a frame covering the entire peripheral edge of liquid crystal panel 11 in a rectangular plate shape. Convex lens 31 is arranged to cover frame region 14 forming the peripheral portion of liquid crystal panel 11. When display 100 is viewed from the front surface side, a display area of liquid crystal panel 11 and convex lens 31 on an outer contour side of that display area are visually recognized as shown in FIG. 4.

Convex lens 31 has a curved surface 32 having a shape of a partial sphere on its front surface side. Curved surface 32 projects from the rear surface side to the front surface side of display 100. A partial area of the surface on the rear surface side of convex lens 31 is formed in a shape of a flat surface, in contact with front surface 12 of liquid crystal panel 11, and fixed to liquid crystal panel 11 as being bonded to front surface 12. Since convex lens 31 is bonded to front surface 12 of liquid crystal panel 11, liquid crystal panel 11 can reliably be supported. For bonding convex lens 31 and liquid crystal panel 11 to each other, for example, an adhesive which is optically transparent and has an index of refraction close to that of a material for forming liquid crystal panel 11 and convex lens 31 is suitably used, such as an acrylic highly transparent double-sided adhesive tape or an ultraviolet curable acrylic resin.

A partial area on the rear surface side of convex lens 31, which is outside an area of bonding to liquid crystal panel 11, is formed in a shape of a flat surface and attached to a front surface of front surface side housing 21 on the front surface side. An extension portion 36 extending to the rear surface side is provided on an outermost peripheral side on the rear surface side of convex lens 31. Extension portion 36 is attached to an outer side surface of front surface side housing 21. Extension portion 36 forms an outermost peripheral portion of a side portion of display 100 over the entire periphery of display 100. Convex lens 31 and front surface side housing 21 can be assembled, for example, by screwing.

In display 100 in the first embodiment shown in FIG. 3, convex lens 31 covers the entire periphery of frame region 14 of liquid crystal panel 11 and covers the entire periphery of the side portion of display 100. Convex lens 31 has a function to protect display 100 and improve appearance of display 100 and has a function similar to that of conventional decorative panel 23. As convex lens 31 has also the function of conventional decorative panel 23, conventional decorative plate 23 can be omitted. Therefore, cost for conventional decorative panel 23 can be reduced and reduction in cost for display 100 can be achieved.

In addition, in conventional display 110 shown in FIG. 7, front surface side housing 21 and decorative panel 23 are interposed between front surface 12 of liquid crystal panel 11 and convex lens 31, whereas in display 100 shown in FIG. 3, front surface side housing 21 alone is interposed between front surface 12 of liquid crystal panel 11 and convex lens 31. Therefore, optical path 34 equivalent to a thickness of decorative panel 23 can be ensured, so that light can be guided to a position closer to the end portion of display 100 as shown in FIG. 3. Therefore, in a case where a multi-display is formed by arranging a plurality of displays 100 two-dimensionally, a multi-display with high image quality in which a juncture between displays 100 is more inconspicuous can be provided.

(Second Embodiment)

Figure 5:
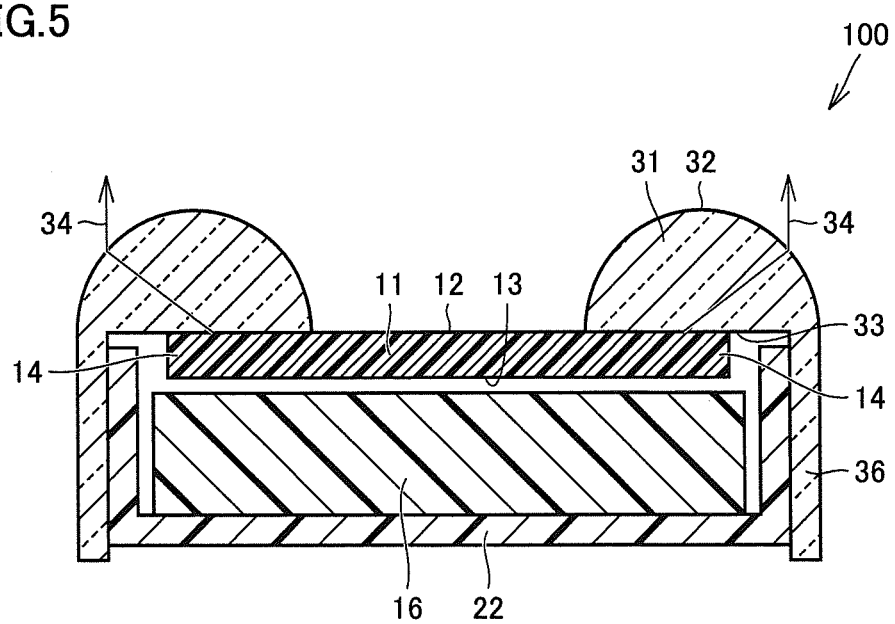
FIG. 5 is a cross-sectional view showing a construction of a display in a second embodiment.

FIG. 5 is a cross-sectional view showing a construction of display 100 in a second embodiment. Display 100 in the second embodiment includes liquid crystal panel 11, backlight unit 16, and rear surface side housing 22 as in the first embodiment. Display 100 in the second embodiment, however, is different from the first embodiment in a construction of convex lens 31.

Specifically, display 100 in the second embodiment does not include front surface side housing 21. Convex lens 31 is in direct contact with rear surface side housing 22 and attached to rear surface side housing 22 without front surface side housing 21 being interposed. Convex lens 31 is arranged on the front surface side of display 100 with respect to rear surface side housing 22 and covers frame region 14 of liquid crystal panel 11 and rear surface side housing 22 from the front surface side. Convex lens 31 is formed in a shape of a frame covering the entire peripheral edge of liquid crystal panel 11 in a rectangular plate shape.

Convex lens 31 has curved surface 32 having a shape of a partial sphere formed on its front surface side. A flat surface 33 is formed on the rear surface side of convex lens 31. Flat surface 33 is in contact with front surface 12 of liquid crystal panel 11 and fixed to liquid crystal panel 11 as being bonded to front surface 12 with an optically transparent adhesive. Since convex lens 31 is bonded to front surface 12 of liquid crystal panel 11, liquid crystal panel 11 can reliably be supported. Convex lens 31 is a planoconvex lens having one surface implemented as spherical curved surface 32 and another surface implemented as flat surface 33 in a planar shape. Convex lens 31 causes flat surface 33 to be in surface contact with front surface 12 of liquid crystal panel 11. Liquid crystal panel 11 is supported by convex lens 31 bonded to front surface 12 from the front surface side, without front surface side housing 21 being interposed.

Extension portion 36 extending to the rear surface side and extending from flat surface 33 toward rear surface side housing 22 is provided on the outermost peripheral side on the rear surface side of convex lens 31. Extension portion 36 is attached to the outer side surface of rear surface side housing 22. Extension portion 36 forms the outermost peripheral portion of the side portion of display 100 over the entire periphery of display 100. Convex lens 31 and rear surface side housing 22 can be assembled, for example, by screwing.

In display 100 in the second embodiment shown in FIG. 5, conventional decorative panel 23 can be omitted as in the first embodiment. Additionally, convex lens 31 extends across liquid crystal panel 11 and rear surface side housing 22, flat surface 33 is bonded to liquid crystal panel 11, and extension portion 36 is attached to rear surface side housing 22, so that liquid crystal panel 11 is supported by convex lens 31. Namely, convex lens 31 has a function to support liquid crystal panel 11 like front surface side housing 21 in the first embodiment. Since convex lens 31 has also a function of front surface side housing 21, front surface side housing 21 can be omitted. Therefore, cost for front surface side housing 21 can be reduced and further reduction in cost for display 100 can be achieved.

In addition, in display 100 shown in FIG. 5, no other member is interposed between front surface 12 of liquid crystal panel 11 and convex lens 31. Therefore, optical path 34 is not blocked by other members such as front surface side housing 21 and optical path 34 equivalent to a thickness of front surface side housing 21 can be ensured as compared with the first embodiment. Thus, light can be guided to a position further closer to the end portion of display 100. Therefore, in a case where a multi-display is formed by arranging a plurality of displays 100 two-dimensionally, a multi-display with higher image quality in which a juncture between displays 100 is even more inconspicuous can be formed.

Furthermore, as convex lens 31 has a function also of front surface side housing 21, a surface of convex lens 31 opposed to front surface 12 of liquid crystal panel 11 is formed as flat surface 33 and there is no height difference between liquid crystal panel 11 and a surface on the rear surface side of convex lens 31. Since no gap is generated between front surface 12 of liquid crystal panel 11 and convex lens 31, optical path 34 from front surface 12 of liquid crystal panel 11 to curved surface 32 of convex lens 31 can be prevented from being divided by a gap and there will be no resultant diffusion of light in the gap. Therefore, light guided from a display area in front surface 12 of liquid crystal panel 11 to the front surface side of frame region 14 is not blocked by front surface side housing 21 or a gap. Thus, luminance of light reaching curved surface 32 of convex lens 31 can be increased and such display unevenness that brightness lowers at a juncture between displays 100 of a multi-display can be lessened.

(Third Embodiment)

Figure 6:
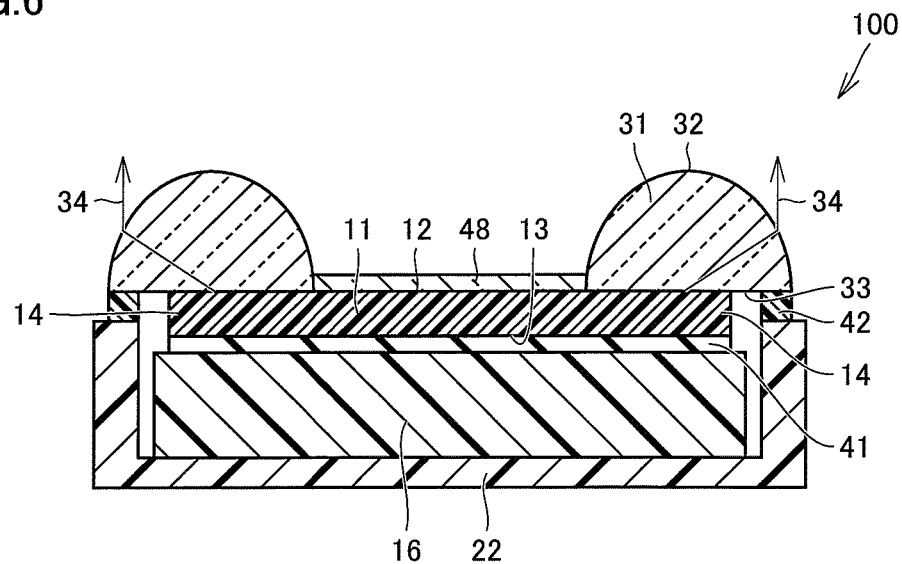
FIG. 6 is a cross-sectional view showing a construction of a display in a third embodiment.

FIG. 6 is a cross-sectional view showing a construction of display 100 in a third embodiment. Display 100 in the third embodiment includes liquid crystal panel 11, backlight unit 16, and rear surface side housing 22 as in the second embodiment. Display 100 in the third embodiment, however, is different from the second embodiment in a construction of convex lens 31 and means for supporting liquid crystal panel 11.

Specifically, liquid crystal panel 11 in the third embodiment is bonded to backlight unit 16 by means of an adhesive layer 41. Convex lens 31 is bonded to front surface 12 of liquid crystal panel 11 as in the second embodiment. By bonding liquid crystal panel 11 to backlight unit 16, rear surface side housing 22, backlight unit 16, liquid crystal panel 11, and convex lens 31 are integrated with one another, so that liquid crystal panel 11 can reliably be supported. Since liquid crystal panel 11 is bonded and fixed from the rear surface side, without sandwiching liquid crystal panel 11 between rear surface side housing 22 and front surface side housing 21 or convex lens 31 as described above, detachment of liquid crystal panel 11 can be suppressed.

In the first and second embodiments, front surface side housing 21 or extension portion 36 of convex lens 31 has had to be arranged in the side surface portion of display 100 and to be assembled together with rear surface side housing 22. On the other hand, in the third embodiment, liquid crystal panel 11 is bonded and fixed to backlight unit 16, so that it is not necessary to arrange front surface side housing 21 or extension portion 36 of convex lens 31 in the side surface portion of display 100. Therefore, since a thickness of the side surface portion of display 100 can be decreased, a narrower frame of display 100 can be achieved. Thus, a multi-display with further higher image quality in which a juncture between displays 100 is even more inconspicuous can be formed.

As shown in FIG. 6, display 100 in the third embodiment further includes a spacer 42 interposed between flat surface 33 on the rear surface side of convex lens 31 and rear surface side housing 22. This spacer 42 is formed from an elastic member which is readily elastically deformable. Spacer 42 is provided to bury a gap formed between convex lens 31 and rear surface side housing 22. Spacer 42 is bonded to rear surface side housing 22, and a gap between convex lens 31 and rear surface side housing 22 can be sealed by pressing convex lens 31 against spacer 42 and elastically deforming spacer 42.

In addition, in the third embodiment, a cover 48 for covering a display area of front surface 12 of liquid crystal panel 11 is provided. This cover 48 can be used for protection of liquid crystal panel 11 or for such an application as a touch panel. Cover 48 may be formed of a material the same as that for convex lens 31, and it may be formed, for example, of an acrylic resin.

It is noted that display 100 which is a liquid crystal display apparatus including liquid crystal panel 11 as a display panel for displaying a video image has been described by way of example in the description of the first to third embodiments. The display apparatus according to the present invention is not limited to the liquid crystal display apparatus. For example, the display apparatus may be a display apparatus for displaying a video image by making use of organic EL, a plasma display, and the like.

Though the embodiments of the present invention have been described as above, the embodiments may be combined as appropriate. In addition, it should be understood that the embodiments disclosed herein are illustrative and non-restrictive in every respect. The scope of this invention is defined by the terms of the claims, rather than the description above, and is intended to include any modifications within the scope and meaning equivalent to the terms of the claims.

REFERENCE SIGNS LIST 1 multi-display; 11 liquid crystal panel; 12 front surface; 13 back surface; 14 frame region; 16 backlight unit; 21 front surface side housing; 22 rear surface side housing; 23 decorative panel; 31 convex lens; 32 curved surface; 33 flat surface; 34 optical path; 36 extension portion; 41 adhesive layer; 42 spacer; 48 cover; and 100 display.

The invention claimed is:

1. A display apparatus, comprising:
a display panel having a front surface and a back surface;
a module that drives said display panel;
a housing that protects and holds said module; and
a light guide member that covers a peripheral portion of said display panel, that guides light from said front surface of said display panel to a front surface side of said peripheral portion, and that supports said display panel from said front surface; wherein said light guide member includes a planoconvex lens causing a flat surface of the light guide member to be in surface contact with said front surface of said display panel.

2. The display apparatus according to claim 1, wherein said light guide member includes an extension portion extending from said flat surface toward said housing and attached to said housing.

3. The display apparatus according to claim 1, further comprising an elastic member interposed between said flat surface and said housing.

4. The display apparatus according to claim 1, being a liquid crystal display apparatus.

* * * * *